United States Patent
Chaney

(10) Patent No.: US 8,895,835 B2
(45) Date of Patent: Nov. 25, 2014

(54) FOLDABLE, PORTABLE, LIGHTWEIGHT PHOTOVOLTAIC MODULE

(75) Inventor: James A. Chaney, Prescott, AZ (US)

(73) Assignee: EnRG Solutions International, LLC, Waipahu, HI (US)

(*) Notice: Subject to any disclaimer, the term of this patent is extended or adjusted under 35 U.S.C. 154(b) by 374 days.

(21) Appl. No.: 13/179,419

(22) Filed: Jul. 8, 2011

(65) Prior Publication Data
US 2013/0008483 A1    Jan. 10, 2013

(51) Int. Cl.
| | |
|---|---|
| H01L 31/042 | (2014.01) |
| B32B 37/10 | (2006.01) |
| B32B 37/06 | (2006.01) |
| H02S 30/20 | (2014.01) |
| H01L 31/048 | (2014.01) |
| B32B 37/12 | (2006.01) |
| B32B 41/00 | (2006.01) |

(52) U.S. Cl.
CPC .......... B32B 37/1009 (2013.01); B32B 37/06 (2013.01); H01L 31/045 (2013.01); H01L 31/048 (2013.01); H01L 31/0485 (2013.01); B32B 37/1207 (2013.01); B32B 41/00 (2013.01); B32B 2307/51 (2013.01); B32B 2309/02 (2013.01); B32B 2309/04 (2013.01); B32B 2457/12 (2013.01); Y02E 10/50 (2013.01)
USPC ........................................ 136/245; 136/244

(58) Field of Classification Search
USPC ................................................. 136/243–265
See application file for complete search history.

(56) References Cited

U.S. PATENT DOCUMENTS

| | | | | |
|---|---|---|---|---|
| 4,400,577 | A | * | 8/1983 | Spear ............................ 136/259 |
| 5,578,141 | A | * | 11/1996 | Mori et al. ..................... 136/251 |
| 6,311,436 | B1 | * | 11/2001 | Mimura et al. ............... 52/173.3 |
| 2004/0216778 | A1 | * | 11/2004 | Ferri et al. ..................... 136/251 |
| 2007/0262204 | A1 | * | 11/2007 | Beidleman et al. ......... 244/172.6 |
| 2009/0000222 | A1 | * | 1/2009 | Kalkanoglu et al. ......... 52/173.3 |
| 2010/0156339 | A1 | * | 6/2010 | Hoffman ....................... 320/101 |

FOREIGN PATENT DOCUMENTS

WO    WO2010/011649    *    1/2010

* cited by examiner

*Primary Examiner* — Jeffrey T Barton
*Assistant Examiner* — Niki Bakhtiari
(74) *Attorney, Agent, or Firm* — Leighton K. Chong

(57) ABSTRACT

A foldable, portable, lightweight photovoltaic module has a carrier layer divided into equal sections separated by hinge spaces, a substrate layer on the carrier layer, and a photovoltaic cell layer on the substrate layer, wherein the hinge spaces each have a free space between opposing edges of the adjacent sections to enable them to be folded in accordion-like fashion for storage. The carrier layer may be made of rip-stop fabric and preferably supports 6 sections each with 6 PV cells of crystalline silicon of up to about 22% conversion efficiency. The module has a power output of about 122 watts at 24 volts, and weighs about 7.4 pounds (3.36 kg), with a power-to-size ratio of 14 watts/sft or more, and a power-to-weight ratio of 16.5 watts/pound or more. An improved method of lamination applies heat and pressure on upper and lower sides of the laminate layers through upper and lower chambers with respective pressure bladders and heaters that are independently controllable.

14 Claims, 8 Drawing Sheets

Stowed

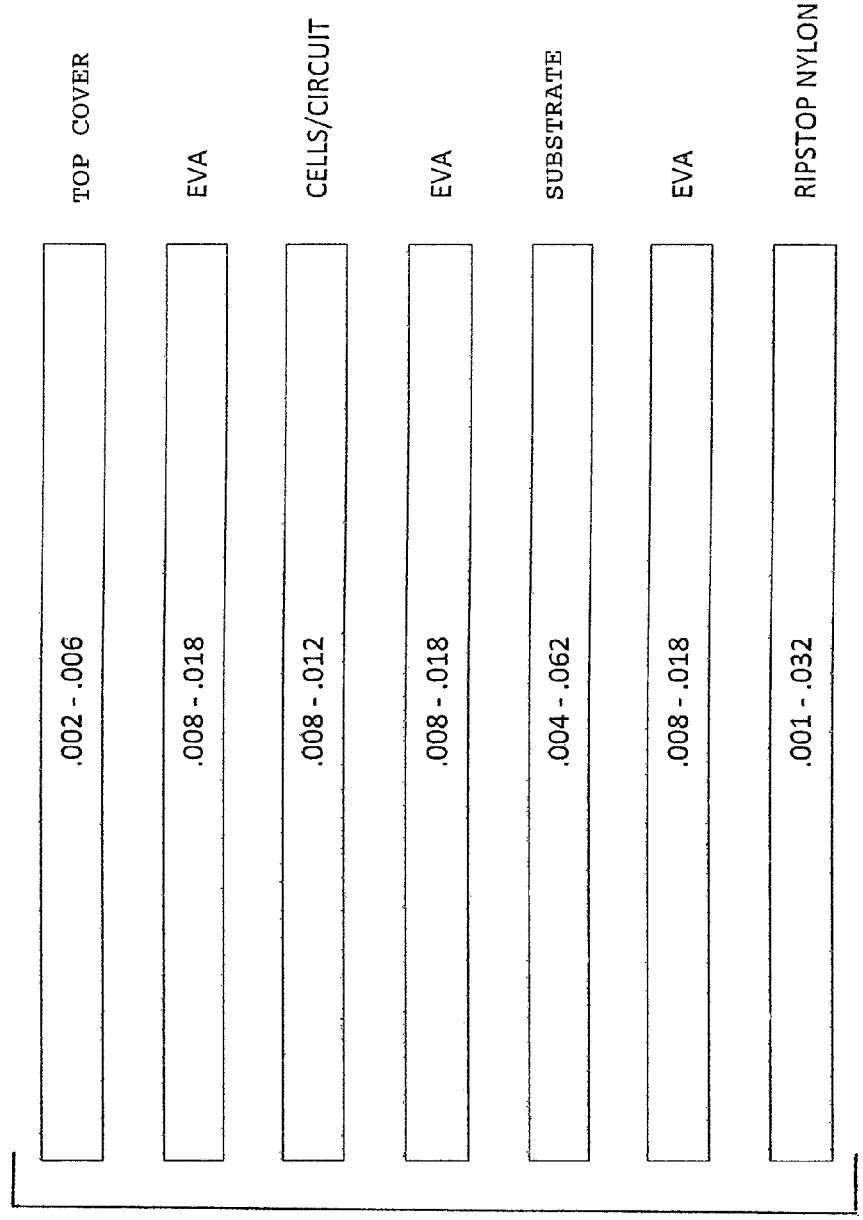
FIG. 5 CROSS SECTION LITE-PM (PV CELL)

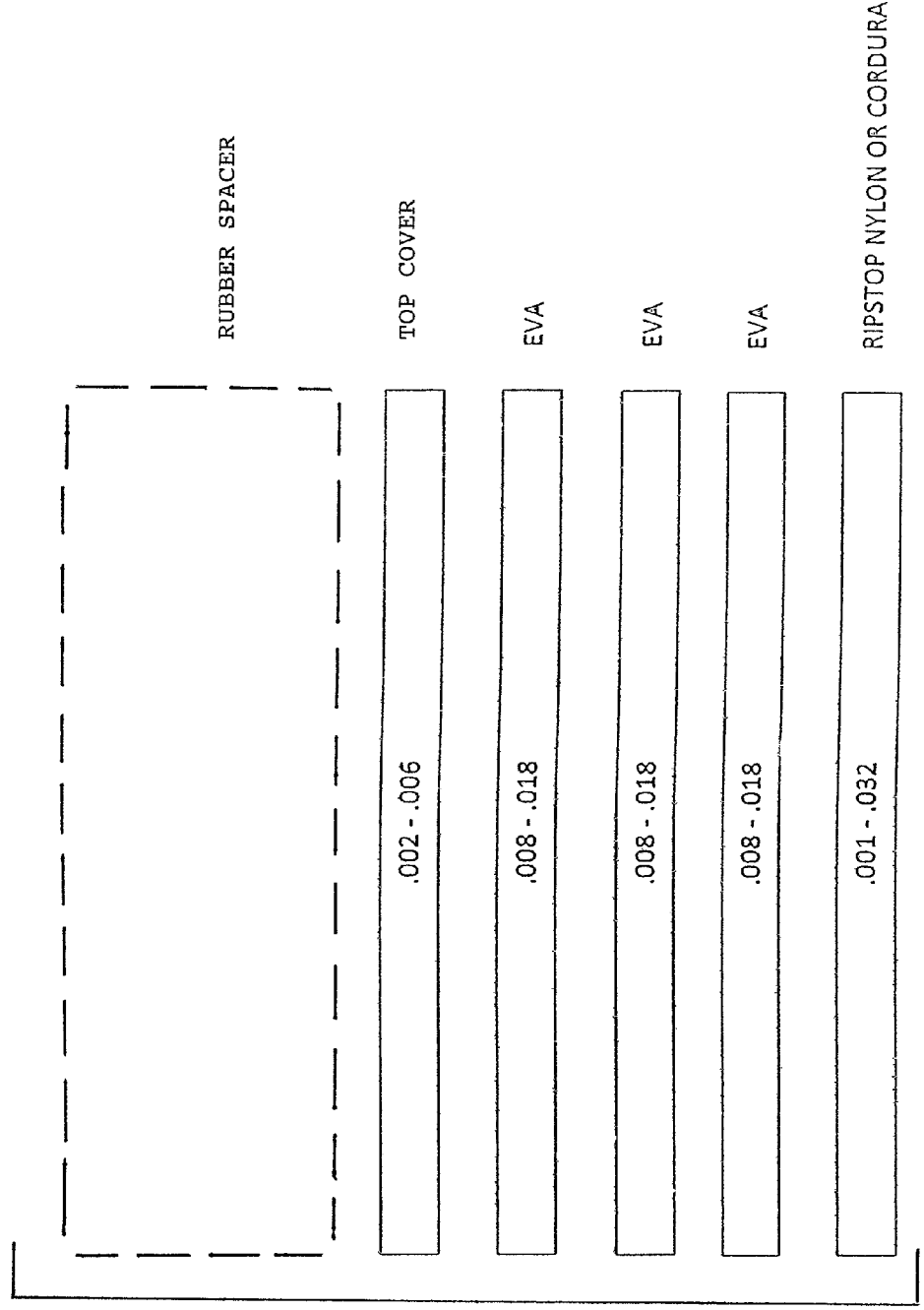

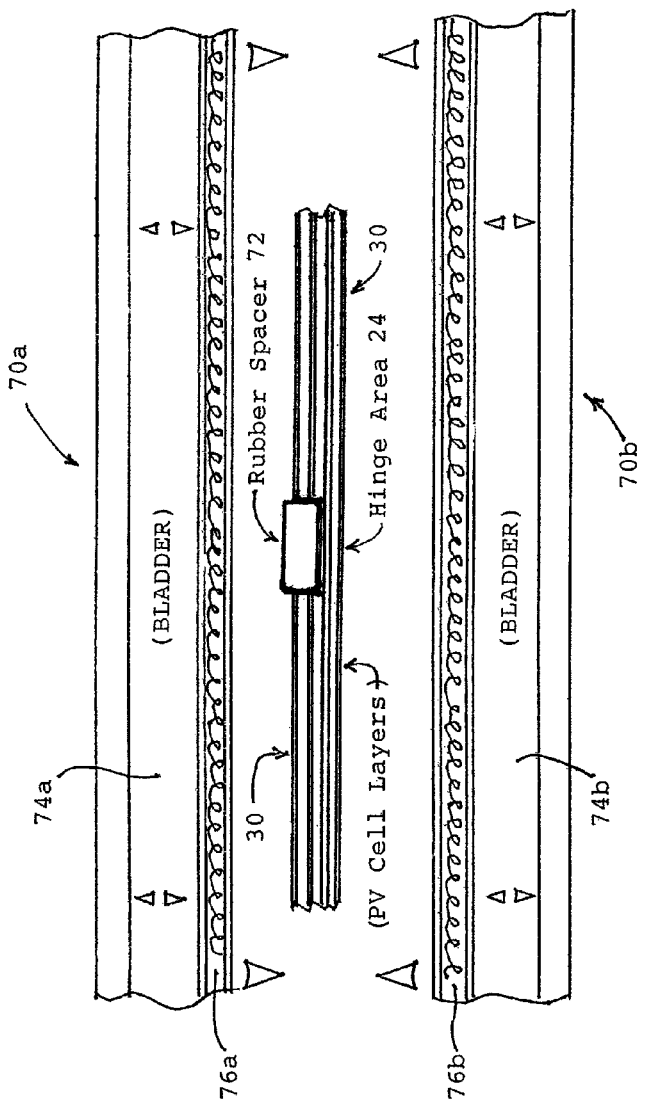

FOLDABLE, PORTABLE, LIGHTWEIGHT PHOTOVOLTAIC MODULE

TECHNICAL FIELD

This U.S. patent application relates to a lightweight photovoltaic module that is foldable and portable, and to an improved lamination method for making the same.

BACKGROUND ART

Conventional solar photovoltaic systems employ silicon-based photovoltaic (PV) cells arranged in arrays on rigid panels that are mounted on a fixed structure, such as the roof of a building. However, there are many field applications where it is desirable to have a solar PV array that is portable and lightweight so that it can be carried by a person and used on treks in remote or mountainous areas, in temporary camps or relief zones, in military field deployments, etc.

Single PV cells or small solar PV arrays have been used to power some types of small, portable electrical devices such as calculators, flashlights, lanterns, mobile phones, etc., but can provide only a low voltage (open circuit) output of about 0.6 volt and maximum power output in the 0.5 to 5 watt range. Medium power intensity applications, such as for powering field computer equipment, premises heating or cooling equipment, satellite and microwave communications equipment, lighting, pumps, hand tools and other field machinery, etc., require a higher level of voltage (open circuit) output in the 12 to 24 volts range and maximum power output in the 100 to 200 watt range. For comparison, a conventional fixed-mount (rooftop) solar PV array using crystalline silicon cells having a solar conversion efficiency of about 14% can provide a voltage (open circuit) output of up to 33 volts and maximum power output of about 200 watts for a panel of about 5 ft×3.2 ft (1.5 sq-m) size that weighs about 37 pounds (17 kg). This size and weight would be too large and heavy for one person to carry on foot comfortably.

Therefore, for medium power intensity uses in remote areas, it would be desirable to provide a solar PV module that is portable enough to be carried by one person on foot, along with that person's other required field equipment. Further, It would desirable that such a personal PV module can be easily disconnected, transferred and quickly re-installed to a new location by one person.

SUMMARY OF INVENTION

In accordance with the present invention, a foldable, portable, lightweight photovoltaic module comprises:

a carrier layer made of durable, flexible and foldable material having a given width and an extended length that is divided into a plurality of equal sections of equal section-length which are separated by hinge spaces extending width-wise between adjacent sections;

a plurality of section-substrates made of a lightweight, semi-rigid material, each lying in a substrate layer and being laminated to a facing surface of said carrier layer and dimensioned to fit within the given width and section-length for each section;

a plurality of photovoltaic section-modules, each lying in a photovoltaic cell layer and being laminated to a facing surface of a respective one of said section substrates, and each being comprised of a plurality of photovoltaic cells dimensioned and arranged to fit with the given width and section-length for each section; and said hinge spaces between adjacent sections each having a free space of a predetermined hinge width between opposing edges of section-substrates laminated to photovoltaic section-modules of the adjacent sections, and wherein said photovoltaic section-modules of adjacent sections are electrically connected in series by flexible wire leads extending loosely across the hinge width of the free space for each pair of adjacent sections and being laminated to an exposed surface of said carrier layer in the free space therebetween, whereby said carrier layer with said sections laminated with said photovoltaic cells can be folded together in accordion-like fashion for storage and unfolded to the extended length of said carrier layer for deployment.

The carrier layer may be made of a synthetic rip-stop fabric, and supports six sections each having six photovoltaic (PV) cells arrayed thereon. The PV cells may be made of monocrystalline silicon that obtains about 22% conversion efficiency. A preferred embodiment of the photovoltaic module can produce a maximum power output of about 122 watts at about 24 volts, and weighs up to about 7.4 pounds (3.36 kg). It has a folded size of about 11.75 inches length×17.5 inches width×0.75 inch thickness (29.8 cm×44.5 cm×1.9 cm), and an unfolded size for deployment of about 72 inches length×17.5 inches width×0.125 inch thickness (182.9 cm×44.5 cm×0.3 cm). The resulting module has a power-to-size ratio of about 14 watts/sft or more, and a power-to-weight ratio of about 16.5 watts/pound or more. The total power output can be multiplied by combining two or more modules together. A PV optical film layer may be added for eliminating reflected glare from sunlight.

In accordance with another aspect of the present invention, an improved method for fabricating a foldable, portable, lightweight photovoltaic module comprises:

providing a carrier layer made of durable, flexible and foldable material having a given width and an extended length that is divided into a plurality of equal sections of equal section-length which are separated by hinge spaces extending width-wise between adjacent sections;

providing a plurality of section-substrates made of a lightweight, semi-rigid material, each lying in a substrate layer on a facing surface of the carrier layer and dimensioned to fit within the given width and section-length for each section;

providing a plurality of photovoltaic section-modules, each lying in a photovoltaic cell layer on a facing surface of a respective one of the section substrates, and each being comprised of a plurality of photovoltaic cells dimensioned and arranged to fit with the given width and section-length for each section;

providing adhesive layers of thermally fusable, transparent film material between the carrier layer and the substrate layer, and between the substrate layer and the photovoltaic cell layer; and providing for hinge spaces between adjacent sections by leaving a free space of a predetermined hinge width between opposing edges of section-substrates and photovoltaic section-modules of the adjacent sections, wherein the free spaces are obtained by inserting removable spacers of a length equal to the given width of the adjacent sections, and connecting the photovoltaic section-modules of adjacent sections electrically together in series by flexible wire leads extending loosely across the hinge width of the free space for each pair of adjacent sections on an exposed surface of the carrier layer in the free space therebetween, and applying heat and pressure on the side of the photovoltaic section-modules and on the side of the carrier layer to laminate the layers of the sections together with the spacers forming the free space of the hinge areas in between, then removing the spacers from the hinge areas, in order to form a final photovoltaic module that can be folded together in accordion-like fashion for storage and unfolded to the extended length of the carrier layer for deployment.

The improved method for laminating a photovoltaic module applies heat and pressure from upper and lower sides of the laminate layers through upper and lower chambers that have respective upper and lower pressure bladder layers and upper and lower heaters that are independently controllable. The heat and pressure are independently controlled in a four-part cycle in sequence wherein:

(a) In a first cycle, air is evacuated from the upper and lower chambers to remove trapped air from between and among the layers;

(b) In a second cycle, atmospheric pressure is restored to the upper bladder so that the upper chamber applies downward pressure to mate the photovoltaic cell layer completely with the substrate layer, and the substrate layer with the carrier layer, even as heat is applied evenly from both upper and lower sides;

(c) In a third cycle, both upper and lower heaters are turned off and a temperature is maintained at which curing of the adhesive films takes place but without excessing heating; and (d) In a fourth cycle, the temperature of the upper and lower heaters are allowed to cool down to below a temperature at which the adhesive layers become set, then the lower bladder is allowed to return to atmospheric pressure.

Other objects, features, and advantages of the present invention will be explained in the following detailed description of the invention having reference to the appended drawings.

BRIEF DESCRIPTION OF DRAWINGS

FIG. 5 is a schematic diagram of the layers that are laminated together to form a photovoltaic section, as seen along view lines V-V in FIG. 4.

FIG. 6 is a schematic diagram of the layers that are laminated together to form a hinge space, as seen along view lines VI-VI in FIG. 4.

FIG. 7A is a schematic diagram of the operation of laminating equipment to laminate the layers of the photovoltaic module together, and FIG. 7B is a diagram listing operational cycles for the upper and lower laminator chambers in the lamination process.

DESCRIPTION OF PREFERRED EMBODIMENTS

In the following detailed description of the invention, certain preferred embodiments are illustrated providing certain specific details of their implementation. However, it will be recognized by one skilled in the art that many other variations and modifications may be made given the disclosed principles of the invention.

Figure 1A:
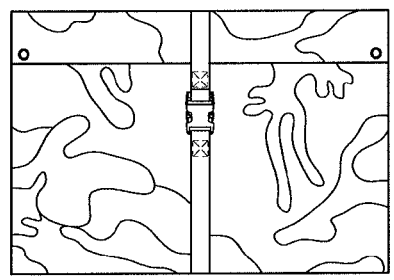
FIG. 1A illustrates a foldable, lightweight photovoltaic module having sections that are folded to a compact size for storage.
Figure 1B:
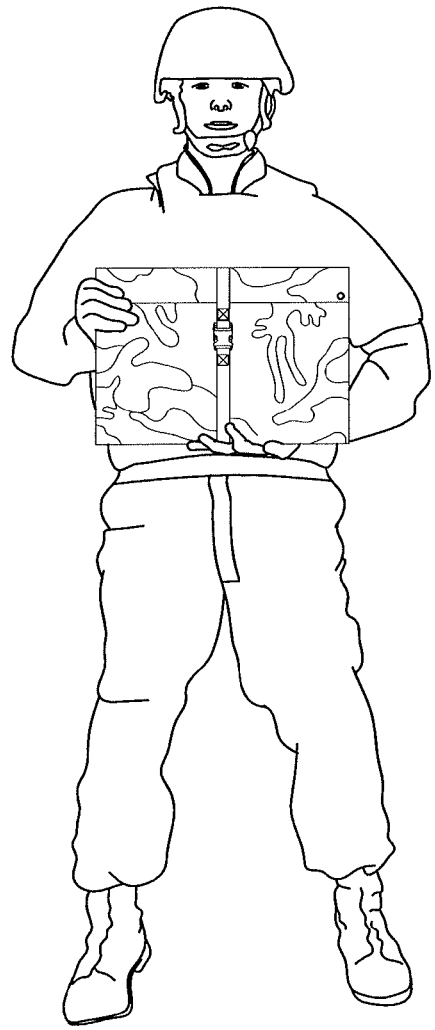
FIG. 1B shows the folded photovoltaic module capable of being comfortably carried by one person.
Figure 1C:
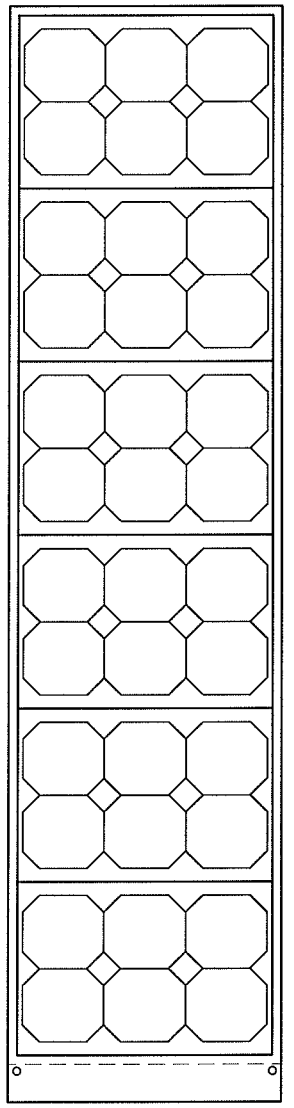
FIG. 1C shows the photovoltaic module unfolded to its full length for deployment.

Referring to FIG. 1A, a preferred embodiment of the present invention is illustrated as a lightweight, multipurpose, folding photovoltaic module that can be integrated into personal equipment or hand carried as a portable energy source for outdoor use. FIG. 1B shows the folded photovoltaic module capable of being comfortably carried by one person. FIG. 1C shows the photovoltaic array unfolded to its full length for deployment. It may be spread on the ground, suspended on tents or poles, draped on vehicles and other structures facing the path of the sun.

Figure 2:
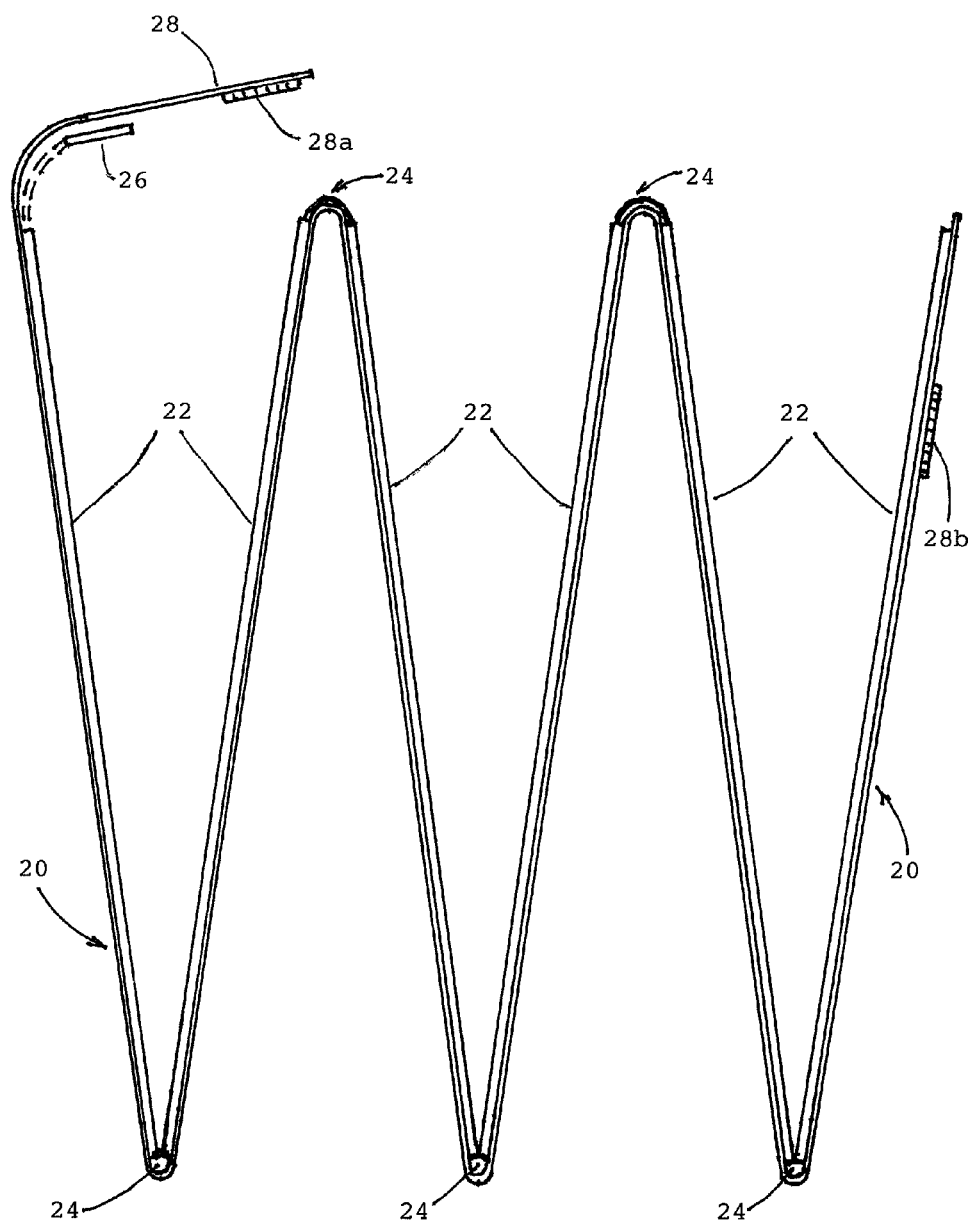
FIG. 2 is a side view of the foldable photovoltaic module being folded together in accordion-like fashion.

In FIG. 2, the preferred embodiment of the photovoltaic module is shown having a carrier layer 20, which is made of durable, flexible and foldable material, six sections 22 of equal length and width laminated with photovoltaic section-modules, and hinge spaces 24 between adjacent sections enabling the sections to be folded in accordion-like fashion. The photovoltaic section-modules are electrically connected in series by flexible wire leads (described in further detail below) and terminate in an electrical connector 26 for connecting to electrical equipment. The folded sections are closed by a flap 28 on the end of a first section that has a fastener half 28a for attachment to its opposite fastener half 28b on the outside surface of the last section. A belt or strap may be secured around the folded sections so that it can be easily carried or hooked onto a field pack.

Figure 3:
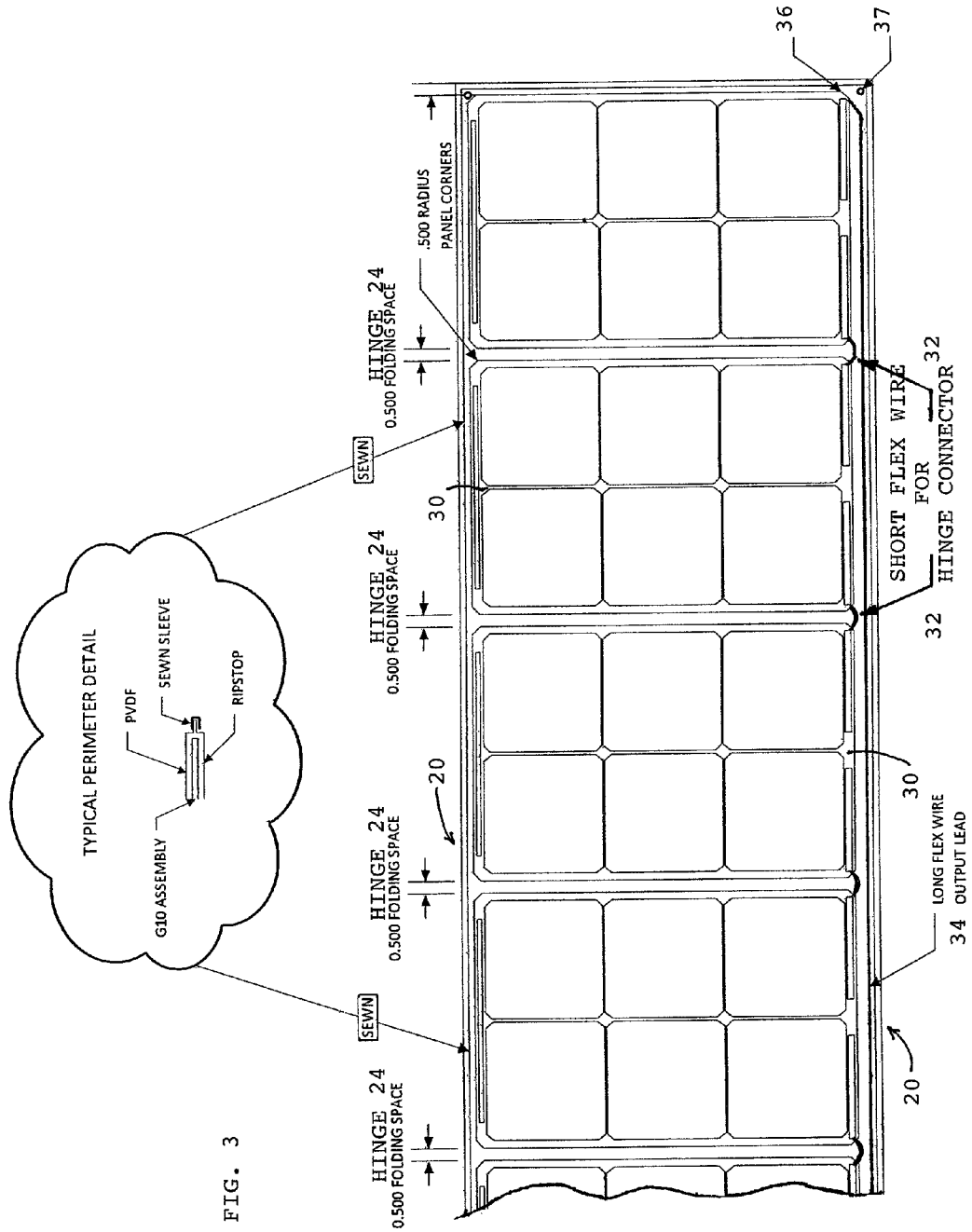
FIG. 3 shows a plan and detail view of the photovoltaic module unfolded for use.

FIG. 3 shows a plan and detail view of the photovoltaic module unfolded for use. The carrier layer 20 underlies the full length and width of the module. Preferred dimensions for the carrier layer are 70 inches×17.25 inches (178 cm×44 cm). The preferred material for the carrier layer is a synthetic rip-stop fabric, such as Nylon or Cordura, for rugged use. Each of the six sections is laminated with a photovoltaic section-module 30 of 6 PV cells each. The longitudinal edges of the carrier layer are sewn to form a sleeve or bead as reinforced edges (see insert for detail). A hinge folding space of 0.5 inch (12.5 cm) is left open between adjacent sections. The photovoltaic section-modules of adjacent sections are electrically connected in series by short flexible wire leads 32 extending loosely across each of the hinge spaces. A long flexible wire lead 34 provides the return path for the electrical output of the module. A reinforced end corner 36 and grommet 37 may be provided at each of the module's four corners to facilitate suspending it from tents or poles.

Figure 4:
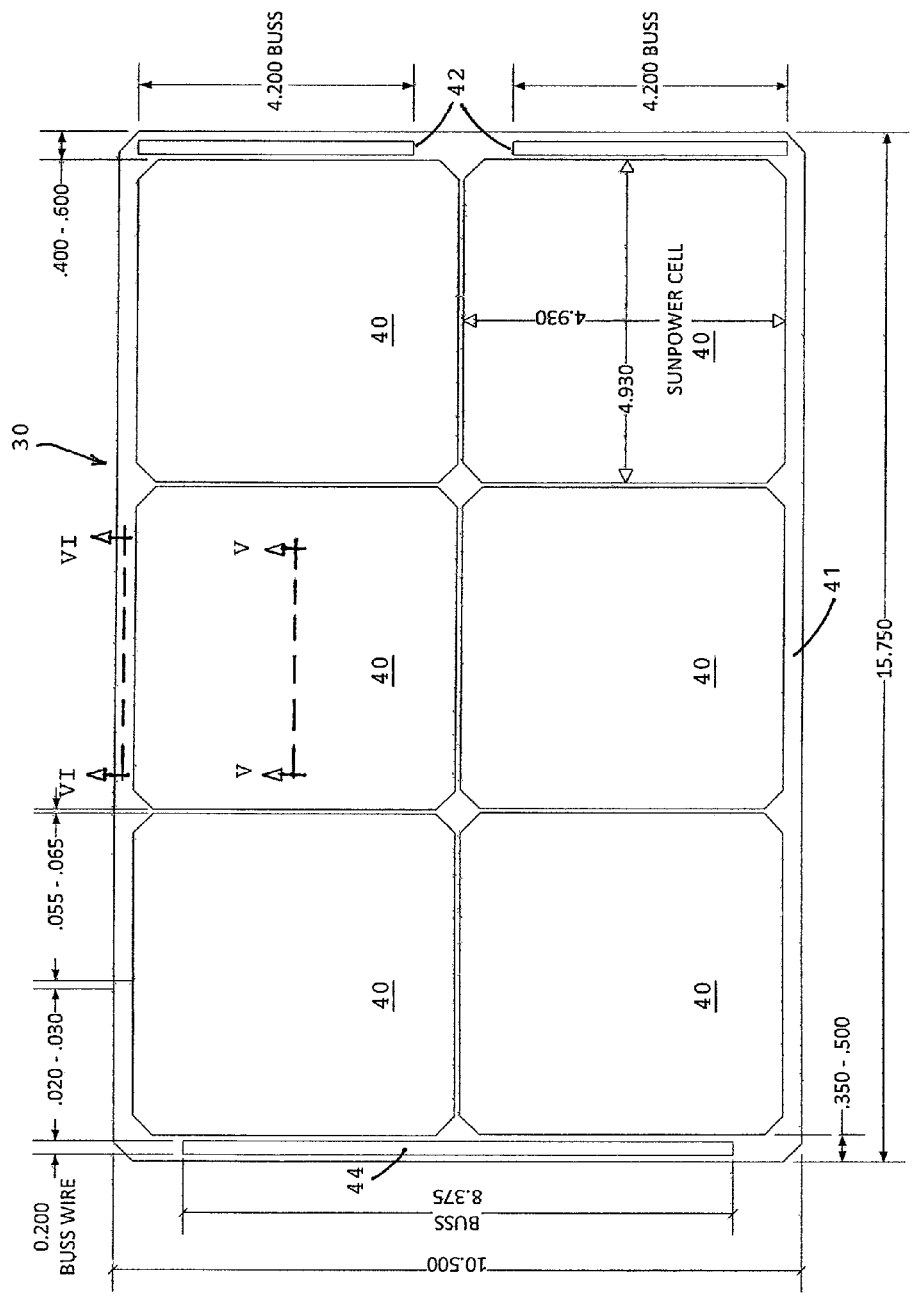
FIG. 4 shows a view of one of the foldable sections of the photovoltaic module.

FIG. 4 shows a view of one of the sections 30 of the photovoltaic module (reoriented in landscape view) comprising six photovoltaic cells 40 laminated on a substrate board 41, which has dimensions of 10.5 inches×15.75 inches (27 cm×40 cm). The substrate board is preferably made of a lightweight semi-rigid material. Widely used materials include woven glass and epoxy, and woven glass and polyester. Thermal expansion is an important consideration especially with die printing technologies, and glass fiber offers good dimensional stability. Other preferred materials include polymer fiber composite, and graphite fiber composite material which has high strength, high rigidity, and is extremely light weight. Conducting layers are laid on the substrate board to form the necessary electrical contacts among the electrical components on the board. An electrical circuit is formed by the top one of the short bus bars 42 making electrical contact with backplane contacts for the top row of PV cells 40, then the long bus bar 44 making electrical contact from the top row to the bottom row of PV cells, and terminating with the bottom one of the short bus bars 42.

Examples of suitable materials for the substrate layer include standard types of printed circuit board (PCB) or glass fiber board. An example of suitable glass fiber material is Garolite™ or "G10" material, available from JJ Orly, Inc., which is a fire-rated electrical-grade, dielectric laminate of epoxy resin combined with a glass fabric substrate. Other suitable substrate materials that are semi-rigid, strong and lightweight may include RockRebar™, available from Southwestern Composite Structures, Inc., Los Angeles, Calif. The material is made from continuous basalt filaments and epoxy polymers. The basalt fibers form a resilient structure substantially stronger that steel or fiberglass.

The PV cells may be made of high-efficiency, mono- or polycrystalline silicon of suitable size. An example of a suitable PV cell is the Sunpower™ cell made by Sanyo Corp., Tokyo, Japan, which is available in sizes of about 5×5 inches (12.5×12.5 cm) or 6×6 inches, and is made of monocrystalline silicon photovoltaic material that can obtain up to 22% solar conversion efficiency. Combining six such PV cells times 6 sections, or 36 total PV cells, the portable photovoltaic module can produce a maximum power output of about 122 watts at a voltage (open circuit) output of up to 24.4 volts and current (short circuit Isc) of 6.2 amps. Other suitable PV cell materials include thin film PV cells such as CDTE (telluride) and CIGS (copper indium gallium selenide).

The module can include a top cover layer of photovoltaic glazing material. A suitable material is Rowlar™ fluoropolymer film, available from Rowland Technologies, Wallingford, Conn., which is made from (polyvinyldene fluoride) PVDF resin. This material has durable weather performance, high efficiency of light energy transmission, lower refractive index than glass, and a matte surface finish for low reflection and glare. Compared to EFTE, it has better transparency, transmission of light over a wider range of incident angles, abrasion-resistance, and is more cost effective.

A portable photovoltaic module fabricated on rip-stop carrier layer laminated with 6×6 PV cells as described above would weigh about 7.4 pounds (3.36 kg) and have a folded size of 11.75 inches length (folded)×17.5 inches width×0.75 inch thickness (29.8 cm×44.5 cm×1.9 cm). Unfolded for deployment, it would have a size of 72 inches length×17.5 inches width×0.125 inch thickness (182.9 cm×44.5 cm×0.3 cm). It has a power-to-size ratio of about 14 watts/sft or more, and power-to-weight ratio of about 16.5 watts/pound or more, which is as much as three times the power-to-size density of conventional small portable or thin film PV modules. Higher power to size and weight ratios can be attained with improvements made to solar conversion efficiency and/or reduction in weight of PV cells and/or reduction in weight of substrate board.

With these robust power output ratings, the photovoltaic module can connect and rapidly charge a wide variety of rechargeable batteries for electrical or electronic equipment in remote applications. It can provide electrical power that is conveniently renewable for daily use. Its light weight and portable size when stowed enable a person to conveniently carry it when trekking on foot along with their other required pack equipment. Power output can be multiplied by combining two or more modules together.

Another aspect of the present invention is an improved process for laminating the carrier, substrate and PV cell layers together to form the foldable photovoltaic module. FIG. 5 illustrates the layers that are laminated together to form a photovoltaic section, as seen along view lines V-V in FIG. 4. The carrier layer is a synthetic rip-stop fabric, such as Nylon or Cordura, which may have a thickness of 0.001-0.32 inch, depending on the intended module and use. A film of thermally fusable material such as ethylvinyl acetate (EVA), having a thickness in the range of 0.008-0.018 inch, is laid on the upper facing surface of the carrier layer. The thermally fused EVA film acts as an adhesive layer and is transparent. Next is the substrate layer having a thickness which may be in a range as low as of 0.004 inch for a graphite fiber sheet, to about 0.062 inch for PCB or G10 board. Another EVA film is laid on the upper facing surface of the substrate layer. The PV cells and circuit bus bars are in the next layer, having a thickness in the range of 0.008-0.012 inch. A top cover (PVDF) layer, having a thickness in the range of 0.002-0.006 inch, is placed on the PV cell layer with an EVA film in between. The PVDF top layer cuts reflection and glare, which is especially desired in military uses.

FIG. 6 illustrates the layers that are laminated together to form a hinge space in between PV sections of the foldable photovoltaic module, as seen along view lines VI-VI in FIG. 4. The hinge space laminate has only the carrier layer, three EVA film layers (if continuous sheets are laid over the entire length of the module), and the PVOF layer, with the substrate and PV cell layers being omitted. A heat-resistant silicone-rubber or other suitable spacer is used to occupy the space of the omitted layers during the lamination process. The spacer may have a rectangular cross-section of about 0.5 inch width×0.1 inch depth, although different widths and thicknesses can be used for different depths and widths of the spacing between opposing sections of laminate layers.

FIG. 7A illustrates the operation of laminating equipment to laminate the layers of the photovoltaic module together. PV panel laminating equipment typically has upper and lower chambers 70a and 70b, respectively, which have flat planar surfaces that apply pressure to the laminate workpiece from upper and lower sides. In an improved process for making the foldable photovoltaic module, both upper and lower chambers have upper and lower pressure bladder layers 74a, 74b, and upper and lower heating layers 76a, 76b, respectively. Heat and pressure is applied from above and below in four distinct process cycles (described in detail below) to the laminate workpiece, shown with PV sections 30 of carrier/substrate/PV cell layers and hinge areas 24 in between them having rubber spacers 72 for forming an open space on the remaining layers.

FIG. 7B is a diagram listing the operational cycles for the upper and lower laminator chambers in the lamination process. The cycles are described in detail below:

First cycle: Air evacuation—this removes trapped air between layers prior to laminating (10-15 minutes). During the first cycle, both upper and lower chambers are evacuating air.

Second cycle: Both upper and lower chamber heaters are turned ON, allowing temperature to slowly ramp up to 50-60 degrees Celsius. Once this temperature is achieved, the upper chamber is stopped from evacuating air and opened back to atmospheric pressure, allowing the bladder to slowly increase pressure towards the bottom chamber (2-3 minutes, so as not to break the fragile PV cells). The lower chamber continues to evacuate air. By the time the upper bladder achieves full pressure, the temperature of the lower heater should be about 75-90 degrees C.

Third cycle: The lower chamber continues to increase in heat until it reaches 148-155 degrees Celsius and maintained for about 5 minutes. Once the target temperature is reached, the upper and lower heaters are immediately turned off. This is the temperature at which the EVA film crosslinks, i.e., is "cured", and should not be allowed to go beyond that temperature and time frame.

Fourth cycle: For the cool down cycle, allow the temperature of the upper and lower heaters to cool down below 100 degrees Celsius (about 30 minutes) at which the EVA material becomes set, while the pressure of the upper bladder is kept at atmospheric pressure and the lower bladder is still evacuating. Once the lower temperature is below 100 degrees, stop the vacuum pump to the lower bladder and allow it to return to atmospheric pressure. The laminator lid is then opened, and the workpiece is moved onto a rack and allowed to cool further (15-20 min).

Finishing: Thread the output flex wire lead though the ripstop nylon sleeve to complete the PV circuit. The module edges are sewn up and a carrying strap is sewn on. Grommets are installed at the four corners. The module is folded up accordion-like and left for final cooling to allow the hinge area fabric to set memory to the final configuration.

In a first cycle of the improved lamination process, air is evacuated from the upper and lower chambers to remove trapped air from between and among the layers that may cause bubbles or uneven registration. In the second cycle, atmospheric pressure is restored to the upper bladder so that the upper chamber applies downward pressure to mate the PV cell layer completely with the substrate layer, and the substrate layer with the carrier layer, even as heat is applied evenly from both upper and lower sides. In the third cycle, both upper and lower heaters are turned off and a temperature for curing the adhesive layers is maintained without excessive heating. In the fourth cycle, the temperature of the upper and lower heaters are allowed to cool down below the temperature at which the adhesive layers become set, then the lower bladder is allowed to return to atmospheric pressure. The use of upper and lower chambers that have upper and lower pressure bladder layers and upper and lower heaters that are independently controllable enables the ideal sequence for heating and pressure to be executed from both sides for thorough and stable lamination of the laminate layers.

The photovoltaic module of the present invention provides a foldable and portable product with robust power-to-weight ratings that enable it to be carried by one person on foot along with other required field equipment. Its light weight and folded size allow it to be easily disconnected, transferred and quickly re-installed to a new location. The photovoltaic module can connect and rapidly charge a wide variety of rechargeable batteries for electrical or electronic equipment in remote applications. Its power output can be easily multiplied by combining two or more modules together. The improved process of lamination of the module enables the application of heat and pressure on upper and lower sides of the laminate layers to be independently controlled.

It is to be understood that many modifications and variations may be devised given the above description of the general principles of the invention. It is intended that all such modifications and variations be considered as within the spirit and scope of this invention, as defined in the following claims.

The invention claimed is:

1. A foldable, portable, lightweight photovoltaic module comprising:
   a carrier layer made of durable, flexible and foldable material having a given width and an extended length that is divided into a plurality of equal sections of equal section length which are separated by hinge spaces extending width-wise between adjacent sections;
   a plurality of section-substrates made of a lightweight, semi-rigid material, each lying in a substrate layer and being adhered by a first adhesive film layer made of a material that is thermally fused and cross-linked to a facing surface of said carrier layer and dimensioned to fit within the given width and section-length for each section;
   a plurality of photovoltaic section-modules, each lying in a photovoltaic cell layer and being adhered by a second adhesive film layer made of a material that is thermally fused and cross-linked to a facing surface of a respective one of said section substrates, and each being comprised of a plurality of photovoltaic cells dimensioned and arranged to fit within the given width and section-length for each section; and
   said hinge spaces between adjacent sections each having a free space of a predetermined hinge width between opposing edges of section-substrates laminated to photovoltaic section-modules of the adjacent sections, and
   a third adhesive film layer of thermally fusable material on the photovoltaic cell layer,
   wherein the hinge spaces have the carrier layer and the first, second and third adhesive film layers where the substrate layer and photovoltaic cell layer are omitted between section-modules,
   wherein said photovoltaic section-modules of adjacent sections are electrically connected in series by flexible wire leads extending loosely across the hinge width of the free space for each pair of adjacent sections and being encapsulated between said third adhesive film layer and said second adhesive film layer with said first adhesive film layer which are adhered to an exposed surface of said carrier layer in the free spaces between section-modules,
   whereby said carrier layer with said sections laminated with said photovoltaic cells can be repeatedly folded together in accordion-like fashion for storage and unfolded to the extended length of said carrier layer for deployment without breakage of the flexible wire leads.

2. A photovoltaic module according to claim 1, wherein the carrier layer is made of a synthetic rip-stop fabric, such as Nylon or Cordura.

3. A photovoltaic module according to claim 1, wherein said carrier layer supports six sections each having a subarray of six photovoltaic cells each.

4. A photovoltaic module according to claim 1, wherein a reinforced end corner and grommet is provided at each of the carrier layer's four corners to facilitate suspending the module for deployment, such as from tents or poles.

5. A photovoltaic module according to claim 1, wherein said substrate boards of the sections are made of a lightweight semi-rigid material selected from the group consisting of: standard printed circuit board (PCB); glass fiber board; woven glass and epoxy; woven glass and polyester; graphite fiber composite; and basalt fiber composite.

6. A photovoltaic module according to claim 1, wherein the photovoltaic cells are made of crystalline silicon having up to about 22% solar conversion efficiency.

7. A photovoltaic module according to claim 1, wherein the resulting module can produce a maximum power output of about 122 watts at a voltage (open circuit) output of up to 24 volts.

8. A photovoltaic module according to claim 1, wherein the resulting module weighs up to about 7.4 pounds (3.36 kg).

9. A photovoltaic module according to claim 1, wherein the resulting module has a folded size of about 11.75 inches length×17.5 inches width×0.75 inch thickness (29.8 cm×44.5 cm×1.9 cm).

10. A photovoltaic module according to claim 1, wherein the resulting module has an unfolded size for deployment of about 72 inches length×17.5 inches width×0.125 inch thickness (182.9 cm×44.5 cm×0.3 cm).

11. A photovoltaic module according to claim 1, wherein the resulting module has a power-to-size ratio of about 14 watts/sft or more.

12. A photovoltaic module according to claim 1, wherein the resulting module has a power-to-weight ratio of about 16.5 watts/pound or more.

13. A photovoltaic module according to claim 1, wherein the total power output from deployment of the module is multiplied by combining two or more modules together.

14. A photovoltaic module according to claim 1, further comprising a top cover layer on the photovoltaic cell layer with the third adhesive film in between, said top layer having properties of high efficiency of light transmission and cutting reflection and glare.

* * * * *